(12) United States Patent
Jensen et al.

(10) Patent No.: US 9,620,400 B2
(45) Date of Patent: Apr. 11, 2017

(54) POSITION SENSITIVE SUBSTRATE DEVICE

(71) Applicant: KLA-Tencor Corporation, Milpitas, CA (US)

(72) Inventors: Earl Jensen, Santa Clara, CA (US); Kevin O'Brien, Menlo Park, CA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 204 days.

(21) Appl. No.: 14/536,428

(22) Filed: Nov. 7, 2014

(65) Prior Publication Data

US 2015/0176980 A1 Jun. 25, 2015

Related U.S. Application Data

(60) Provisional application No. 61/919,708, filed on Dec. 21, 2013, provisional application No. 62/029,306, filed on Jul. 25, 2014.

(51) Int. Cl.
*G01B 11/14* (2006.01)
*H01L 21/68* (2006.01)

(52) U.S. Cl.
CPC .......... *H01L 21/68* (2013.01); *H01L 21/681* (2013.01)

(58) Field of Classification Search
CPC ..................................................... G01B 11/14
USPC ...................................................... 356/614
See application file for complete search history.

(56) References Cited

U.S. PATENT DOCUMENTS 7,230,727 B2 * 6/2007 Chu ................. G01B 11/002
356/420

| | | | |
|---|---|---|---|
| 7,672,000 B2 * | 3/2010 | Hayashi | G03F 7/70691 356/401 |
| 2008/0042051 A1 | 2/2008 | Sidor et al. | |
| 2008/0106723 A1 | 5/2008 | Hoogendam et al. | |
| 2010/0134122 A1 | 6/2010 | Furumura et al. | |
| 2011/0069297 A1 * | 3/2011 | Lafarre | G03F 7/70341 355/72 |
| 2011/0074341 A1 | 3/2011 | Jensen et al. | |

(Continued)

FOREIGN PATENT DOCUMENTS

JP 09138110 A 5/1997

OTHER PUBLICATIONS

U.S. Appl. No. 13/886,671, to Earl M. Jensen, filed May 3, 2013.

(Continued)

*Primary Examiner* — Roy M Punnoose
(74) *Attorney, Agent, or Firm* — Joshua D. Isenberg; JDI Patent

(57) ABSTRACT

Some aspects of the present disclosure relate to a system having a substrate device, a substrate support surface, and a substrate handler that positions the substrate device on the substrate support surface. The substrate device and the substrate support surface may have counterpart coarse position units and fine position units. The system may measure coarse positional offsets between the first and second coarse position units, re-position the substrate device on the substrate support surface based on the coarse positional offsets, and subsequently measure fine positional offsets between the first and second fine position units. In some implementations, the substrate device is integrally coupled to the substrate handler via a wireless communication link in order to communicate position information as feedback for further placement.

43 Claims, 6 Drawing Sheets

(56) References Cited

U.S. PATENT DOCUMENTS

| | | |
|---|---|---|
| 2011/0174777 A1 | 7/2011 | Jensen et al. |
| 2012/0203495 A1 | 8/2012 | Sun et al. |
| 2012/0318966 A1 | 12/2012 | Jensen et al. |
| 2013/0155390 A1 | 6/2013 | Jensen et al. |
| 2014/0122654 A1 | 5/2014 | Jensen |
| 2014/0192840 A1 | 7/2014 | Sun et al. |
| 2014/0253928 A1 | 9/2014 | Jensen |

OTHER PUBLICATIONS

International Search Report and Written Opinion for International Application No. PCT/US2014/070662, dated Mar. 31, 2015.

\* cited by examiner

POSITION SENSITIVE SUBSTRATE DEVICE

CROSS-REFERENCE TO RELATED APPLICATION

This application is a nonprovisional application that claims the priority benefit of U.S. Provisional Application No. 61/919,707, to Earl Jensen et al., filed on Dec. 21, 2013, entitled "POSITION SENSITIVE SENSOR WAFER WITH WIRELESS CAPABILITY AND VIBRATION LOGGING", the entire contents of which are herein incorporated by reference.

This application is a nonprovisional application that also claims the priority benefit of U.S. Provisional Application No. 62/029,306, to Earl Jensen et al., filed on Jul. 25, 2014, entitled "POSITION SENSITIVE SENSOR WAFER WITH WIRELESS CAPABILITY AND VIBRATION LOGGING", the entire contents of which are herein incorporated by reference.

FIELD

The present disclosure relates to substrate processing and analysis and associated systems and methods.

BACKGROUND

Substrate processing used in the manufacture of semiconductor devices and other electronics is a carefully controlled process that often involves close monitoring and post-processing inspection and analysis in order to optimize fabrication processes and improve yield. Advancements in fabrication processes and fab level automated material handling systems (AMHS) have led to a high degree of automation that has improved efficiency in many aspects of substrate processes. Material handling systems often include systems that automatically transport lots of substrates among different tools in specialized carriers, commonly front opening unified pods (FOUP), and robotic handlers may be used at the tools to load individual substrates from the carriers onto a stage for processing or post-processing review.

Occasionally, undesired particles and other contaminants can have adverse effects on fabrication, and post processing review, e.g., inspection, metrology, or other analysis, is often used to gather information regarding processing conditions and other useful information. To combat this and gather more useful information, special substrate-like sensor devices, sometimes known as "sensor wafers" when used in the context of semiconductor wafer processing, are often used along with the ordinary production substrates (e.g., production wafers fabricated into operational electronic devices) in order to gather additional information regarding processing conditions. Typically, these substrate devices are designed to have dimensions and other physical parameters similar to the production substrates of interest in order to closely approximate the effects of processing conditions on production substrates, but usually these substrate devices also include additional specialized electronics for extracting additional data. These sensor wafers may be placed in a FOUP along with other production substrates and placed in a production chamber in a manner similar to other substrates. Data is typically subsequently extracted after the relevant processing stage to obtain additional useful information regarding processing conditions.

In many situations related to substrate processing and post-processing inspection, precise positioning and positional information is critical. For example, an inspection tool may have an electron microscope or other electron beam system capable of resolving features at a very small micro- or nano-scale, but conversely have a very narrow field of view that requires the substrate to be precisely positioned relative to the tool in order to locate particular particles or defects on the substrate and gather useful data. Precise information regarding the position of a substrate relative to the tool thus becomes critical for locating a particular small scale defect, particle, or other area of interest on the substrate. In these situations, a time consuming process requiring manual intervention is typically used. This usually involves manually mounting optics, sighting the wafer in (using wafer targets), and manually entering positional offsets to the wafer handlers.

BRIEF DESCRIPTION OF THE DRAWINGS

The teachings of the present disclosure can be readily understood by considering the following detailed description in conjunction with the accompanying drawings, in which:

FIG. 1A depicts an example substrate device, FIG. 1B depicts an example substrate support surface, and FIG. 1C depicts the substrate device of FIG. 1A positioned on the substrate support surface of FIG. 1B.

DETAILED DESCRIPTION

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Some aspects of the present disclosure relate to a substrate device having physical parameters that approximate a production substrate used in the manufacture of integrated circuits or other electronics, such as a silicon wafer. In some implementations, the substrate device includes a substrate, such as a wafer substrate, having electronics and/or positional targets disposed on the substrate which may be used for optically measuring a position of the substrate device relative to a substrate support surface, such as a wafer stage.

Some further aspects of the present disclosure relate to measuring a relative position between a substrate device and a substrate support surface. According to some aspects, this may include both coarse position measurements and fine position measurements. According to some additional aspects, relative position measurements may be taken using proximity optics. According to yet further aspects, the substrate device may be operatively coupled to the substrate handler via a communication link, and position information regarding the relative positions may be conveyed from the substrate device to a handler via the communication link as feedback for further placement.

According to some further aspects, the forgoing substrate device is capable of gathering motion, orientation, or acceleration information. According to some aspects of the present disclosure, such information may be used to log vibrations of the substrate device during transport of the substrate device by a robotic handler. This may be used to ascertain safe velocity profiles during substrate handling by a robotic handler.

According to yet additional aspects, the forgoing substrate device is also capable of gathering particulate information regarding particulate matter in surrounding air.

Figure 1A:
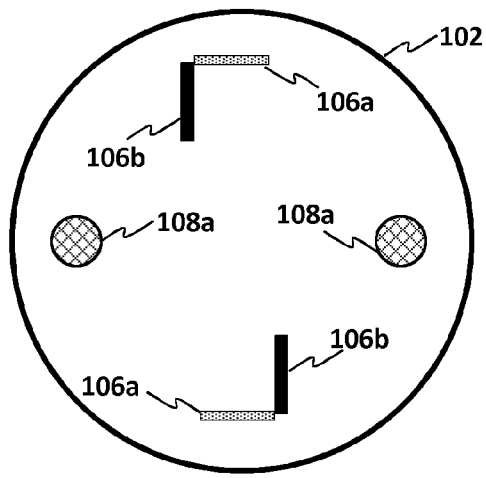
FIG. 1A-1C are schematic diagrams depicting a plan view (top view) of an example substrate device and an example substrate support surface according to certain aspects of the present disclosure.
Figure 1B:
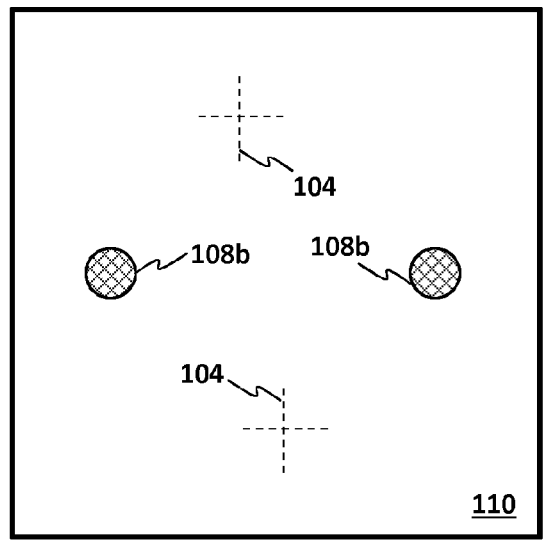
Figure 1C:
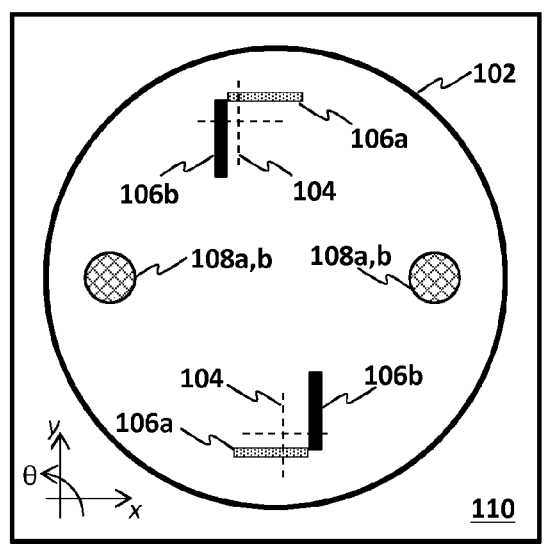
Figure 2:
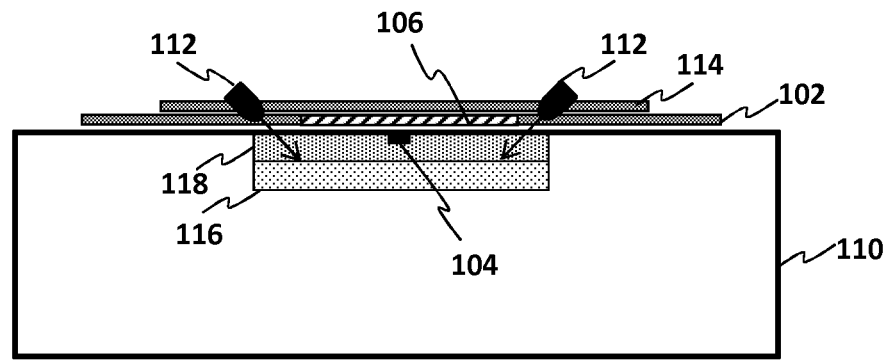
FIG. 2 is a schematic diagram depicting a profile view (front or side view) of a substrate device overlying a substrate support surface during coarse measurements according to certain aspects of the present disclosure.
Figure 3:
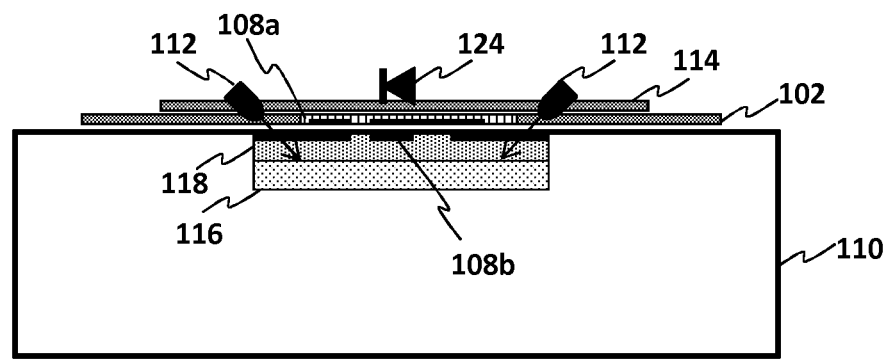
FIG. 3 is a schematic diagram depicting a profile view (front or side view) of a substrate device overlying a substrate support surface during fine measurements according to certain aspects of the present disclosure.

FIGS. 1A-3 depict an example of system illustrative of some aspects of the present disclosure. The example system has a substrate device 102 and a support surface 110 that receives the substrate device. The support surface 110 may be part of a device, e.g., a chuck, that has some mechanism to secure the substrate device in place relative to the support surface. By way of example, and not by way of limitation, such a chuck may be a mechanical chuck, a vacuum chuck, a magnetic chuck, an electrostatic chuck. Such chucks are often used to secure substrates, such as semiconductor wafers, in substrate processing tools. FIG. 1A depicts just the substrate device 102, FIG. 1B depicts just the substrate support surface 110, and FIG. 1C depicts the substrate device 102 positioned on the substrate support surface 110. FIGS. 2-3 depict a profile view (front or side view) of the substrate device 102 overlying a substrate support surface 110. FIG. 2 differs from FIG. 3 in that FIG. 2 highlights the coarse measurement features of the above example while FIG. 3 highlights the fine measurement features of the above example.

As shown in FIGS. 1A-3, in the illustrative system both the substrate device 102 and the underlying support surface 110 may each include positional units to facilitate determination of the position of the substrate device relative to the support surface. The positional units may be counterparts to each other so that a relationship between the two position units, i.e., the position unit in the substrate device and the position unit in the substrate support surface, may be used to gather information regarding the relative position between the substrate device 102 and the support surface 110. In some implementations, the position units are optical units and the counterpart relationship involves the units being aligned when the substrate device 102 is properly positioned on the underlying support surface 110, allowing positional offsets between the units to be measured using proximity optics in order to obtain accurate positioning information for the substrate device. Moreover, in some implementations, the substrate device 102 and the support surface 110 include both counterpart coarse position units and counterpart fine position units.

In illustrated example of FIGS. 1A-1C, coarse position unit of the substrate device 102 is represented collectively by the components 106a,b, while the counterpart coarse position unit of the support surface 110 is represented collectively by the components 104. Similarly, the fine position unit of the substrate device 102 is represented collectively by the components 108a, while the fine position unit of the substrate support surface 110 is represented collectively by the components 108b.

According to some aspects of the present disclosure, the substrate device 102 may be substrate-like and have physical parameters that approximate the physical parameters of a production substrate used in the manufacture of integrated circuits or other electronics. An example of such a production substrate is a semiconductor wafer, preferably made of single crystal silicon but possibly made from another semiconductor material, such as a compound semiconductor. The production wafer may be a round wafer that preferably has a diameter between 100 mm and 450 mm and more preferably has a diameter of 300 mm or 450 mm. The production substrate may also have a thickness between 525 microns (for a 100 mm silicon wafer) and 925 microns (for a 450 mm silicon wafer).

In some implementations of the present disclosure, the substrate device 102 may have physical parameters that approximate the parameters of the forgoing production substrate. For example, the substrate device 102 may have a diameter in the range of 100-450 mm, and more preferably a diameter of about 300 mm or about 450 mm similar to those production wafers most commonly used now or expected to be commonly used in the future by many semiconductor fabrication facilities (fabs). The substrate device 102 may also have a thickness that approximates the corresponding thickness of the production substrate, although it may be slightly thicker than a corresponding production substrate in order to accommodate additional electronics and/or other components in the substrate device. For example, the substrate device may have a thickness between 500 microns and 1000 microns. In addition, the substrate device 102 may be made of a composite material, e.g., two or more layers of material that are bonded together or two or more materials that are intermixed in a single layer or multiple layers. To accommodate a more mechanically durable substrate that a silicon wafer, the substrate may also be a composite material such as graphite/epoxy or even a laminate made up of silicon, graphite/epoxy, silicon. This combines the best of the compatible clean surfaces of single crystal silicon the toughness of a graphite composite material.

In some implementations, in order to approximate physical parameters of a production substrate, the substrate device 102 may include a substrate, such as a wafer substrate made from silicon or another semiconductor material, and one or more additional components may be disposed on the substrate in order to provide other functionality. These additional components may include various electronics and/or position units in accordance with certain aspects described herein. Using silicon or a similar substrate for the substrate device 102, as opposed to materials such as metal or graphite composites, is advantageous as it better ensures surfaces are clean and avoids contamination of the surrounding environment by the substrate device. In some implementations, at least some of the additional components disposed on the substrate may be contained within one or more enclosures 114 that may protect electronics or other components from the surrounding environment. Preferably, the enclosure is in the form of one or more "pucks" that have a low profile to minimize mass and minimize the thickness (i.e., the profile or envelope) of the substrate device.

According to some aspects of the present disclosure, the substrate support surface 110 may be any support surface configured to receive substrates. For example, in some implementations the substrate support surface is a surface of a wafer stage configured to receive semiconductor wafers. In other implementations, the support surface 110 is a support surface of an end effector of a robotic wafer handler. In yet further implementations, the supporting surface may be some other surface that receives substrates. In other alternative implementations, the system may be configured to position the substrates relative to the handler instead of the support surface 110.

In some implementations of the present disclosure, the substrate device 102 is configured to communicate with a substrate handler in real-time in order re-position the substrate device 102 on the support surface 110 based on coarse measurements between the coarse position units 104 and 106a,b and fine measurements between the fine position units 108a and 108b, so that the substrate device may both gather the position measurements and be positioned on the support surface based on the measurements to within a desired degree of accuracy. To facilitate this, the substrate device 102 may have electronics that include a communication link, preferably a wireless communication link such as Bluetooth, in order to convey position information to the handler for feedback that may be used by the handler to adjust the position of the substrate device 102 on the support surface 110 in real-time based on the position information. Accordingly, the communication link between the substrate device and the handler may advantageously provide an operable coupling between the substrate device and the handler.

In some implementations of the present disclosure, the coarse position units 104, 106a,b, the fine position units 108a,b, or both are optical position units that rely on proximity optics in order to take measurements regarding the relative positioning of the counterpart units. Generally speaking, the coarse position units may include features that provide a wider field of view than the fine position units, while the fine position units may provide a higher degree of precision than the coarse position units. Utilizing both coarse position measurements and fine position measurements may facilitate measurements at a wider range and at a higher degree of precision than would otherwise be possible using either the fine position measurements or the coarse position measurements alone.

Preferably, both coarse and fine position measurements are combined with communication of the position information to the substrate handler, e.g., using an operative communication link between the substrate device and the handler as described above, so that coarse position information may be used initially by the system as feedback for further placement, followed by subsequent fine positioning. This may allow the substrate device 102 to be precisely positioned using a process having two main steps, an initial coarse measurement and positioning step, and a subsequent fine measurement and positioning step. This may be highly advantageous when automating the use of certain tools, such as an electron microscope or other electron beam system, which require precise positioning to locate a particle or other aspect of a substrate.

According to some aspects of the present disclosure, the counterpart coarse position units 104 and 106a,b, the counterpart fine position units 108a and 108b, or preferably both sets of position units are used to gather offset measurements that include both X-direction offsets and Y-direction offsets defined with reference to an X-Y coordinate plane, such as is shown in FIG. 1C. It is noted that while an X-Y coordinate plane is used for purposes of illustration, it is understood that equivalent axes and/or directional offsets may be used without departing from the principles described herein. In addition to X-Y offsets, the system may measure rotational offsets (θ) of the substrate device 102 relative to the support surface 110. In some implementations of the present disclosure, the coarse position units and the fine position units may each include at least two spaced apart constituent units to obtain rotational offset measurements, including both coarse rotational offsets and fine rotational offsets. For example, each coarse position unit may include two distinct spaced apart constituent units in spaced apart locations relative to the area of the substrate, shown in the FIGS. 1A-1C as the two distinct sets of components 106a,b for the substrate device 102 and the two distinct sets of components 104 for the substrate support surface 110, and each fine position unit may also include two distinct spaced apart constituent units, shown in the FIGS. 1A-1C as the two distinct sets of components 108a for the substrate device 102 and the two distinct sets of components 108b for the substrate support surface 110. The system may then determine a rotational moment of the substrate device 102 based on the two distinct sets of measurements, which provides information regarding a relative rotational offset (e.g., along the θ-direction in FIG. 1C) that might not be present if only a single location were used.

It is important to note that in FIG. 1A-1C the coarse position units 104 and 106 are depicted far apart from the fine position units 108a and 108b, respectively, for purposes of illustration and to differentiate the two in the schematic diagram. However, in some implementations of the present disclosure the coarse and fine position units may be disposed in very close proximity or adjacent to one another in order to provide efficient and accurate measurement. Moreover, while the two constituent sets in each of the position units are depicted as being spaced rather far apart from each other (e.g., the two spaced apart sets of coarse position units 106a, 106b are depicted proximate opposing ends of the area of the substrate, and similarly for each of the two spaced apart sets of 104, the two spaced apart sets of fine position units 108a, and the two spaced apart sets of fine position units 108b), it is possible for these to be spaced apart in arbitrary locations within the area of the substrate, provided that each of the position units in the substrate device 102 should be placed in locations that correspond to their counterparts in the substrate support surface 110. In general the determination of angular rotation improves with increasing spacing between the pairs of coarse position units 106a, 106b and with increasing spacing between the fine position units 108a, 108b.

With reference to FIGS. 1A-1C and FIG. 2, the support surface 110 may include one of the coarse position units 104 while the substrate device 102 may include a counterpart coarse position unit 106a,b to facilitate the measurement of positional offsets therebetween. In some implementations, each of these positioning units is a dedicated optical unit that provides position sensitive capabilities in the substrate device 102.

According to some aspects of the present disclosure, one of the two counterpart coarse position units may include a coarse target 104, while the other counterpart coarse position unit includes an optical detector 106a, 106b. When the substrate device 102 overlies the stage 110, the optical detector may be used to detect offsets relative to the target. In the illustrated example of FIGS. 1A-3, the coarse position unit that has the coarse target includes two distinct crosshair targets 104, while the coarse position unit that has the optical detector includes two distinct sets detectors, in which each set includes a pair of position sensitive detectors 106a and 106b oriented substantially perpendicular to one another. The two perpendicular detectors in each pair may facilitate detection of offsets in the X-direction and Y-direction relative to corresponding perpendicular bars of the crosshair target 104. In some implementations, each position sensitive detector may be a line camera having a linear array of photosensing pixels. In the illustrated example, line cameras 106a may facilitate determination of X-direction offsets, while line cameras 106b may facilitate determination of Y-direction offsets. Accordingly, in these implementations the optical detector 106a,b does not need to take a complete image and attempt to process the full image in order to locate a target or particle, but rather may simply detect a linear offset in each of the X- and Y-directions relative to the target 104, corresponding to the X- and Y-oriented linear detectors. This may advantageously simplify the operation of the system and improve efficiency of computations associated with processing the gathered positional data to determine offsets.

Figure 4:
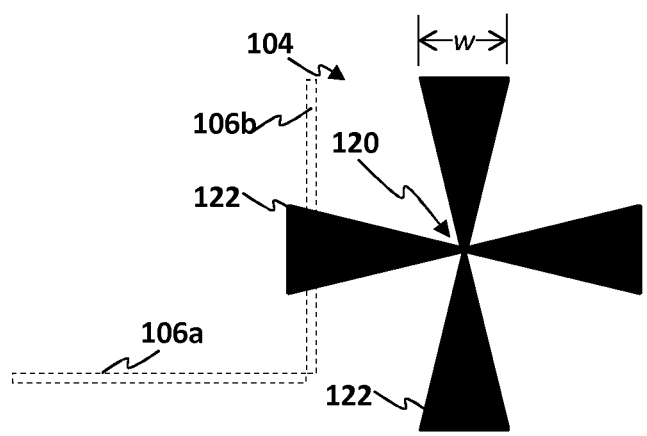
FIG. 4 is a schematic diagram depicting an example of a coarse target according to certain aspects of the present disclosure.

FIG. 4 depicts an example of a crosshair target 104 according to certain additional aspects of the present disclosure. In certain implementations, the crosshair 104 may include intersecting elements in the form of substantially perpendicular bars 122, which may correspond to the pair of perpendicularly oriented position sensitive detectors 106a,b in a corresponding set of the counterpart coarse position unit. The system may be configured to measure the offsets by detecting a relative position of each of bars 122 in the crosshair using a respective one of the linear detectors. In the illustrated example of FIG. 4, the crosshair target 104 includes additional features to facilitate more accurate offset measurements relative to a center 120 of the target. Specifically, in this example the crosshair 104 includes outwardly extending elements 122 in which the outwardly extending elements include widening portions that increase in width as they extend away from the center 120 of the target 104. Accordingly, if one of the two linear detectors 106a,b is off, this feature allows them to extract additional information regarding a degree to which they are off based on the thickness of the bars that are detected. More importantly, if the output of the linear detectors reflects changes in the width of the crosshair it is possible to determine from such changes whether the linear detectors are moving toward the center 120 or away from it along the x and y directions. The "double bowtie" crosshair 104 shown in FIG. 4 gives an XY offset in an area that is essentially a fat crosshair offset. Alternative implementations may use a single bowtie target instead of the double bowtie 104 in conjunction with a single sensor (e.g., a line camera) to provide both X and Y position with a single sensor, albeit with less precision in one direction and a smaller range.

Preferably, the coarse position units are able to resolve position down to a precision of about 50 microns. For example, in some implementations the detectors 106a,b include linear diode arrays that are able to measure position to +/−1 pixel, corresponding to +/−63.5 microns. To facilitate this kind of performance without proximity optics, the linear diode array may be less than 25 microns away from a mask having the coarse target. In some implementations, each coarse position target 104 may have a diameter of about 10 mm. In other implementations, the coarse position target 104 may have a diameter between 5 and 25 mm. In yet further implementations, other sizes may be used. The optimal dimensions of the target 104 depend partly on the dimensions of the detectors 106a,b and the required capture range. For example, if the sensor is about 8 millimeters (mm) long and the capture range is about 9 mm, the minimum target size would be about 10 mm. In such a case, the size of the target 104 may range from about 10 mm to about 20 mm. It is emphasized that the crosshair depicted in FIG. 4 is only a schematic illustration of an example of a coarse target, and other forms, shapes, and sizes may be used in accordance with the present disclosure.

Preferably, the coarse position unit which has the optical detector 106a,b is included in the substrate device 102 while the coarse position unit which has the coarse target is included in a support surface mask 118 disposed on the support surface 110, although it is possible to measure the offsets with these reversed by detecting coarse targets on the substrate device with detectors on the support surface. In such implementations, the optics and electronics may be integrated into the support surface 110 and the substrate device 102 would become the target. When coupled with an operative communication link between the substrate device and the substrate handler, the substrate device 102 may be configured to gather the offset measurements using the optical detectors of its coarse position unit and then convey position information regarding these offsets to a handler via a wireless communication link, which may then subsequently utilize the offset measurements to automatically re-position the substrate device 102 on the support surface 110. This feedback may allow the system to accurately position the substrate device on a support surface to within a high degree of precision automatically and in real-time.

With reference to FIG. 2, the coarse targets 104 may be included in a mask 118 disposed on the support surface, e.g., a stage mask for a wafer stage. In some implementations, the mask may include a passive back illumination unit 116 on its backside so that when it is disposed on the substrate support surface 110, the visibility of the target 104 is enhanced and a higher quality signal can be obtained by a corresponding detector 106a,b of the counterpart position unit. In the illustrated example, the substrate device 102 includes an illuminator 112 that is configured to illuminate the passive back illumination unit 116 of the mask 118.

In some implementations, the passive back illumination unit 116 may be a phosphor that is excited by one or more light sources, e.g., one or more LEDs. For example, the substrate device 102 may have an illuminator 112 that has one or more blue LEDs configured to excite the phosphor. In other implementations, the passive back illumination unit 116 may have a structured surface that evenly spreads light through scattering. For example, it may have a microstructured surface that diffuses light through scattering from an edge-lit LED. Preferably, in implementations in which the substrate device has an illuminator, the illuminator has at least two LEDs arranged on opposing peripheral ends of mask 118 in order to provide edge-lit illumination to the passive back illumination unit, e.g., a phosphor or microstructured surface. Although the illuminator is depicted as providing illumination to a phosphor back illuminator from the front side (i.e., from the substrate device 102), aspects of the present disclosure are not limited to such implementations. In alternative implementations, the the illuminator may 112 may be integrated into the support surface 110 and may provide illumination to a non-phosphor back illumination unit 116 from the back or sides, e.g., in the manner of illumination units used in LCD displays.

With reference to FIGS. 1A-1C and FIG. 3, some aspects of the present disclosure relate to fine measurements and positioning using fine position units. The support surface 110 may include one of the fine position units 108*b* while the substrate device 102 may include another fine position unit 108*a* that is a counterpart to the fine position unit of the substrate support surface, as shown in the illustrate example. In some implementations, each of these positioning units is a dedicated optical unit that provides position sensitive capabilities in the substrate device 102.

In some implementations, both of the fine position units, e.g., both the fine position unit of the substrate device 108*a* and the fine position unit 108*b* of the substrate support surface 110 include at least one target, which may face each other when the substrate device 102 is placed on the substrate support surface 110. Preferably, each of the fine position units 124 includes at least two spaced apart targets, which may be advantageous for calculating fine rotational offsets (A) between the substrate device and support surface for similar reasons to those described above with respect to the coarse rotational offsets.

According to some aspects of the present disclosure, the fine position units may also rely on proximity optics to detect a relative position between the counterparts in the substrate device and the substrate support surface. In some implementations, the fine position units of the substrate device 102 and the substrate support surface 110 include complementary Vernier patterns 108*a* and 108*b*, which may face each other when the substrate device is placed on the substrate support surface. For example, one of the complementary Vernier patterns may include an incremental Vernier scale in the form of a repeating normalized pattern, while the complementary Vernier pattern may include a complementary incremental Vernier scale in the form of a repeating normalized pattern having slightly smaller period or a phase offset, so that the two Vernier patterns complement one another. A phase offset allows for phase detection, which can be particularly useful. Near field optical detection may be used to detect fine positional offsets between the complementary Vernier patterns 108*a* and 108*b* from the opposing interference patterns when the substrate device overlies support surface.

In some implementations, a fine position detector having set of photodiodes 124 may be used to detect the relative offsets between the respective Vernier patterns 108*a* and 108*b* of the substrate device 102 and the substrate support surface 110. More specifically, a plurality of photodiodes may be used, e.g., three or more photodiodes for each set of complementary Vernier patterns, which may detect illumination from the back illumination unit 116 that passes through the Vernier patterns 108*a* and 108*b* to the photodiode 124. The output of the photodiode function that may be converted to a digital value, e.g., via an analog to digital converter (ADC). The amount of illumination that passes through the two Vernier patterns depends on the relative alignment of the two patterns. The photodiode 124 therefore produces a output as a function of position that has a peak when the two Vernier patterns are aligned to allow the most illumination through to the photodiode. The two Vernier patterns 108*a* and 108*b* may be positioned such that the peak in the signal from the photodiode 124 occurs when the substrate device 102 is perfectly centered or otherwise perfectly aligned with respect to the support surface 110. In some implementations, the set of photodiodes includes a distinct set of photodiodes for each of the X-direction and the Y-direction, as well as at least one photodiode for a reference. By way of example, and not by way of limitation, in some implementations the set of photodiodes may include three photodiodes in X-direction, three photodiodes in the Y-direction, and at least one photodiode used as a reference. In some implementations, this allows the detector of the fine position units to be able to resolve less than about 2 microns. Preferably, the fine position unit having the detector portion, e.g., the set of photodiodes 124, is includes in the substrate device 102, as shown in FIG. 2, and the substrate device is configured to convey the detected fine position information to the handler.

Although aspects of the present disclosure may be implemented with a single photodiode, it is often advantageous to use two or more. With one photodiode one may detect a change as the relative position is changed between the targets. The addition of one or more reference photodiodes allow the apparatus to normalize the signal such that absolute offsets can be determined. Having more sets of Vernier patterns but offset ±½ period allows for magnitude and directions, given that the patterns are within +1 period.

Figure 8A:
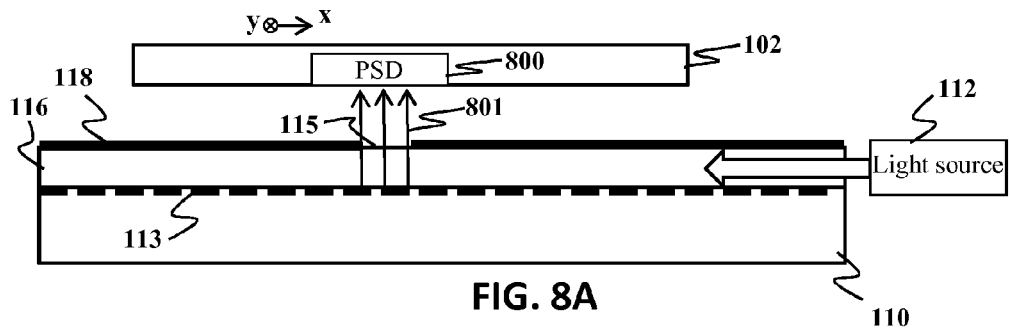
FIG. 8A is a schematic diagram of an alternative system having a substrate device and a substrate support according to certain aspects of the present disclosure.
Figure 8B:
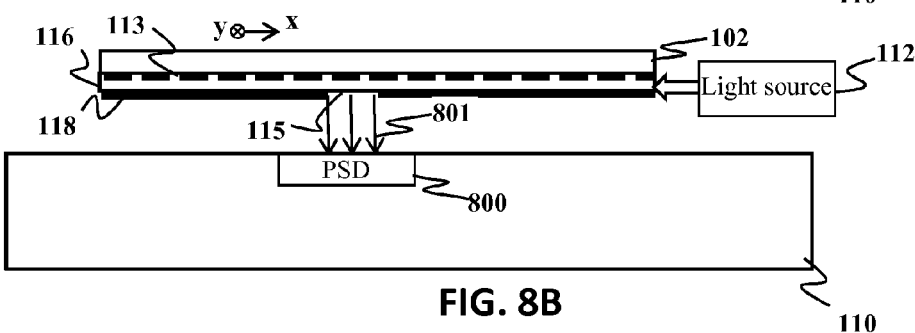
FIG. 8B is a schematic diagram of another alternative system having a substrate device and a substrate support according to certain aspects of the present disclosure.

In another implementation, shown in FIG. 8A, the substrate device 102 may include coarse position sensor in the form of a two dimensional (2D) position sensitive detector (a PSD) 800, e.g., a 2D photo diode may provide the centroid of a spot of illumination to the PSD. In the example shown in FIG. 8A, the substrate support 110 may include a light source 112 that is configured to illuminate a phosphor 113 of a passive back illumination unit 116 that is behind a mask 118. A spot of illumination 801 may be projected through a hole 115 in the mask 118 that is mounted stationary with respect to the substrate support 110. The mask aperture preferentially has a circular shape. In yet another implementation, shown in FIG. 8B, the PSD 800 and illumination spot 801, may be located on the substrate support and the phosphor 113, hole 115, illumination unit 116, mask 118, may be located on the substrate device 102. As a practical matter, it is desirable for the size of the hole (and therefore the spot of illumination 801) to be smaller than the area of a light sensitive portion of the PSD 801.

The illumination unit 116 may include an optical element that guides light from the light source 112 to the phosphor 113. The illumination unit 116 may also include optical element that diffuses light from the phosphor to provide uniform illumination to the hole 115 so that the spot of illumination 801 is uniform. By way of example, and not by way limitation, the optical element may include an optically diffusive material that scatters light from the phosphor 113 The spot of illumination 801 acts as the coarse position target 104. Signals from the 2D PSD 800 can be analyzed to provide a course estimation of the misalignment between the illumination spot 801 and the PSD 800 in a manner similar to the dual line cameras described above.

The term 2D Position Sensitive Device and/or Position Sensitive Detector (PSD) refers to an optical position sensor (OPS), that can measure a position of a light spot in one or two-dimensions on a sensor surface. 2D PSDs includes sensors that have an isotropic sensor surface that has a raster-like structure that supplies continuous position data as well as devices that have discrete sensors on the sensor surface that supply local discrete data. Examples of isotropic sensors include designs based on a so-called PIN diode. As used herein, and as is generally understood by those skilled in the art, a PIN diode is a diode with a wide, lightly doped 'near' intrinsic semiconductor region between a p-type semiconductor and an n-type semiconductor region. The p-type and n-type regions may be heavily doped for use as ohmic contacts. In a PIN diode, the depletion region exists almost completely within the intrinsic region. When a photon of sufficient energy enters the depletion region of the diode, it creates an electron-hole pair. The reverse bias field sweeps the carriers out of the depletion region creating a current.

Figure 8C:
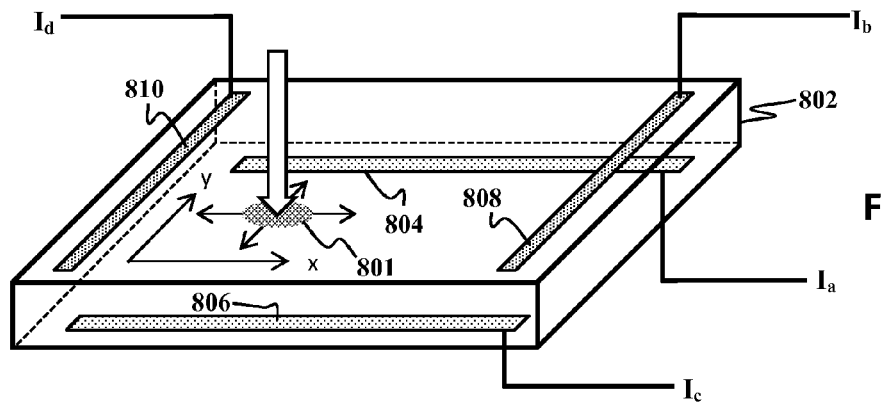
FIG. 8C is a schematic diagram illustrating a possible implementation of a two-dimensional coarse position sensor that may be used in conjunction with the system shown in FIG. 8A or FIG. 8B.

According to a first non-limiting example, the PSD 800 may be a PSD 800B based on a PIN diode configured as shown in FIG. 8C. In this example, a PIN diode is formed on a laminar semiconductor 802. The PIN diode is exposed to a tiny spot of light 801. This exposure causes a change in local resistance and thus electron flow in four electrodes 804, 806, 808, and 810. Two of the electrodes 804, 808 are located near opposite edges of one side of the laminar semiconductor 802 parallel to an x-axis and two other electrodes 806, 810 are located on an opposite side of the laminar semiconductor along two edges parallel to a y-axis. From the currents $I_a$, $I_b$, $I_c$ and $I_d$ in electrodes 804, 806, 808, and 810 respectively, the location of the centroid of the light spot 801 can be computed using the following equations.

$$x = k_x \cdot \frac{I_b - I_d}{I_b + I_d}$$

and $$y = k_y \cdot \frac{I_a - I_c}{I_a + I_c}$$

The $k_x$ and $k_y$ are simple scaling factors, which permit transformation into coordinates.

This type of 2D PSD can continuously measure the position of the light spot 801 at measuring rates up to over 100 kHz. The position measurement is most linear when the light spot 801 falls near the center of one face or the other but becomes nonlinear near the edges. The position measurement also depends somewhat on the form and size of the light spot 801. This as well as the nonlinear connection can be partly compensated by appropriate configuration of the shapes of the electrodes 804, 806, 808, and 810.

Figure 8D:
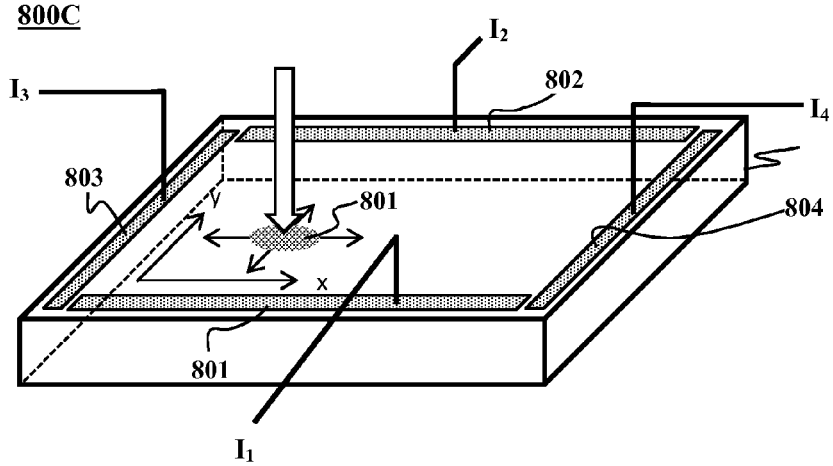
FIG. 8D is a schematic diagram illustrating an alternative possible implementation of a two-dimensional coarse position sensor that may be used in conjunction with the system shown in FIG. 8A or FIG. 8B.

According to a second non-limiting example, the course position PSD may be a 2D tetra-lateral PSD 800C, as shown in FIG. 8D. This type of PSD is capable of providing continuous position measurement of the incident light spot in two dimensions. It consists of a single square PIN diode with a resistive layer. When there is an incident light on the active area of the sensor, photocurrents are generated and collected from four electrodes 811, 812, 813, 814 placed along each edge of a square side laminar semiconductor 802. The position of the incident light 801 can be estimated based on currents $I_1$, $I_2$, $I_3$, and $I_4$ collected from the electrodes 811, 812, 813, and 814, respectively:

$$x = k_x \cdot \frac{I_4 - I_3}{I_4 + I_3}$$

and $$y = k_y \cdot \frac{I_2 - I_1}{I_2 + I_1}$$

The 2D tetra-lateral PSD 800C has the advantages of fast response, much lower dark current, easy bias application and lower fabrication cost. The position measurement accuracy and resolution are independent of the incident light spot shape and size. However, it still suffers from nonlinearity. While the position estimate is approximately linear with respect to the real position when the spot is in the center area of the PSD, the relationship becomes nonlinear when the light spot is away from the center.

To reduce the nonlinearity, the x and y positions may be estimated by alternative equations:

$$x = k_{x1} \cdot \frac{(I_4 - I_3)}{I_0 - 1.02(I_2 - I_1)} \cdot \frac{0.7(I_2 + I_1) + I_0}{I_0 + 1.02(I_2 - I_1)}$$

and $$y = k_{y1} \cdot \frac{(I_2 - I_1)}{I_0 - 1.02(I_4 - I_3)} \cdot \frac{0.7(I_4 + I_3) + I_0}{I_0 + 1.02(I_4 - I_3)}$$

where: $I_0 = I_1 + I_2 + I_3 + I_4$, and: $k_{x1}$, $k_{y1}$ are scale factors.

Figure 5:
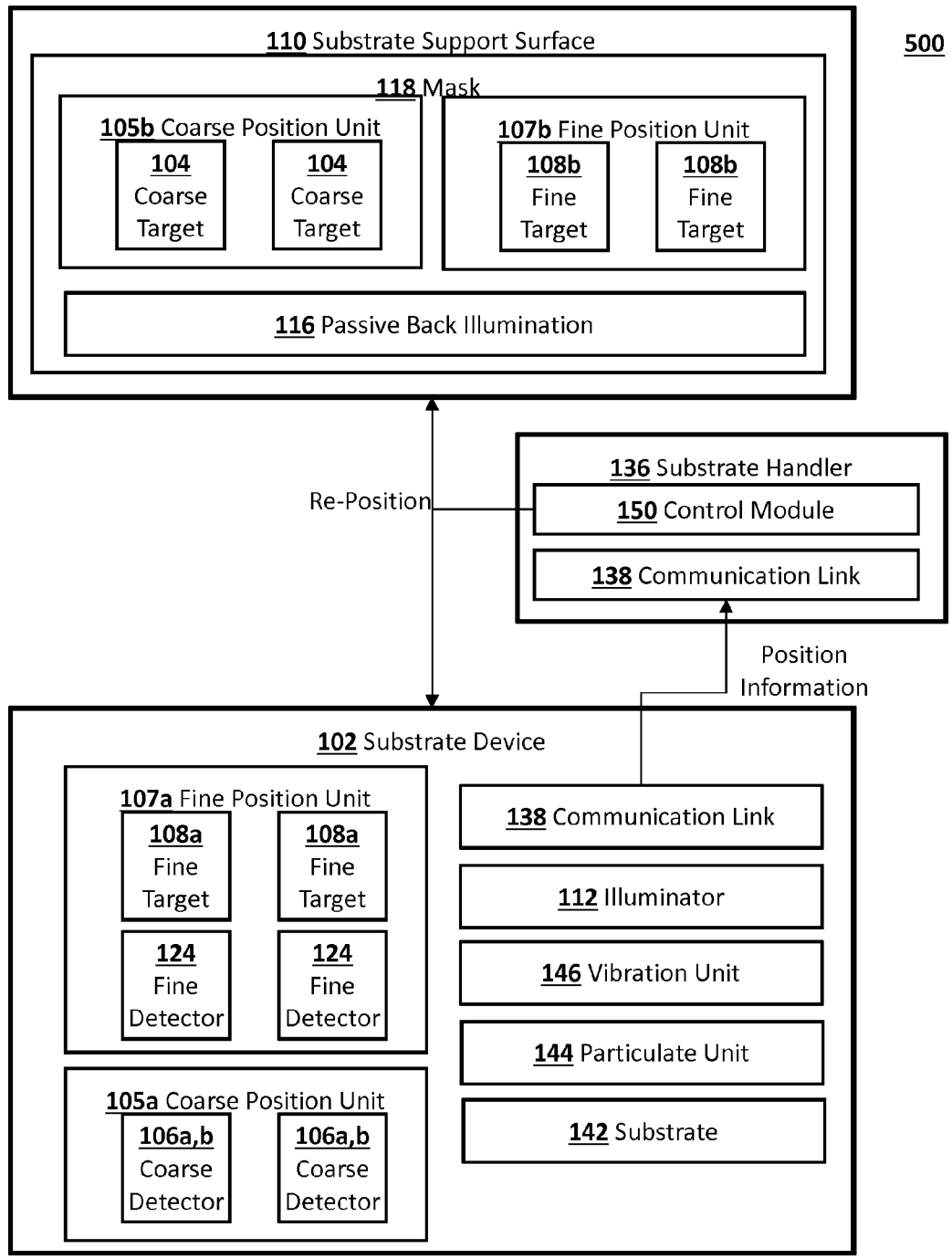
FIG. 5 is a block diagram of a system according to certain aspects of the present disclosure.
Figure 6:
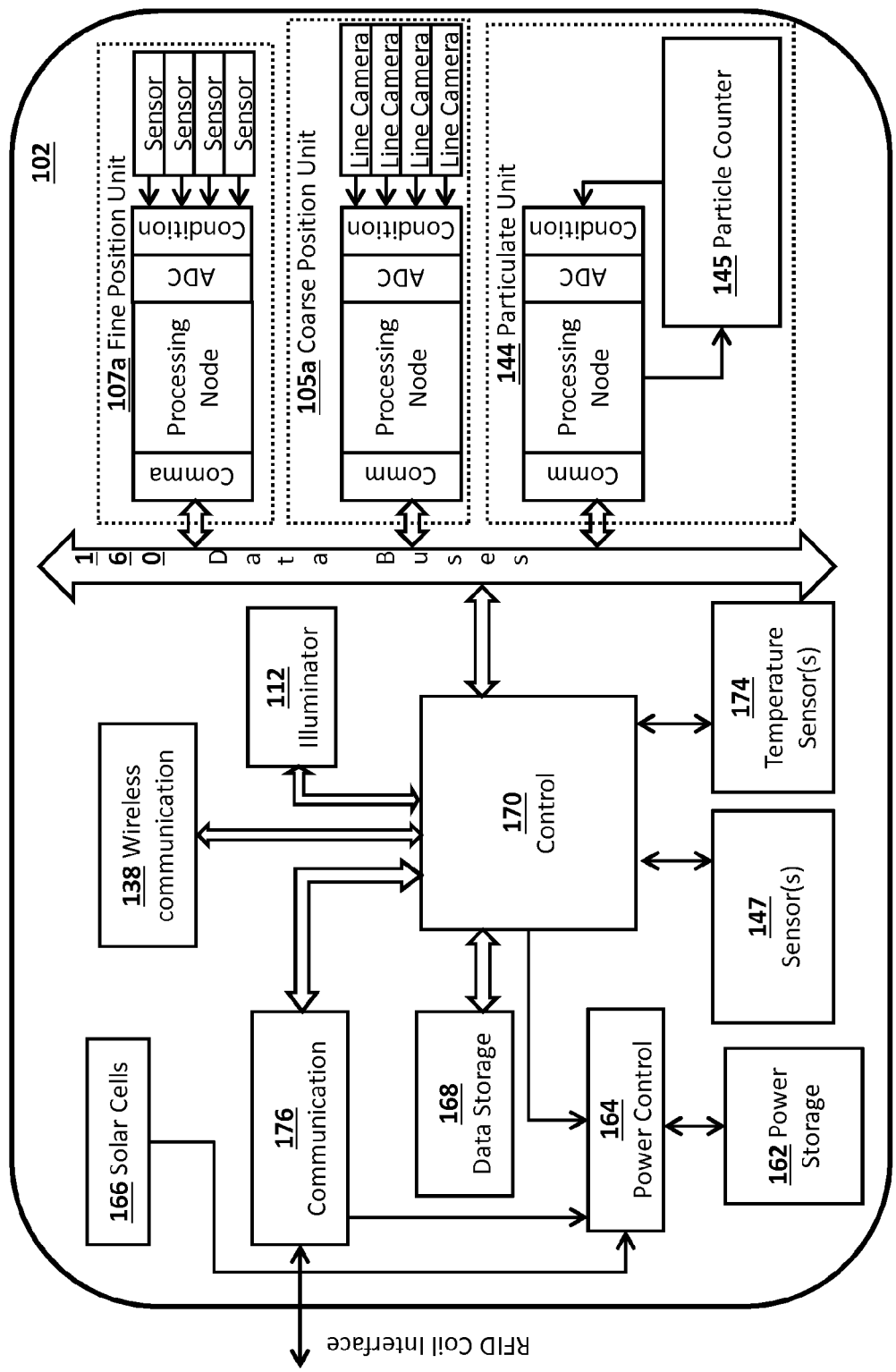
FIG. 6 is a block diagram of electronic components of a substrate device according to certain aspects of the present disclosure.

FIGS. 5 and 6 depict a block diagram of a system according to some aspects of the present disclosure. In particular, FIG. 5 depicts a block diagram of a system 500 having a substrate device 102, a substrate support surface 110, and a substrate handler 136 configured to position the substrate device 102 on the substrate support surface 110. FIG. 6 depicts a block diagram of the substrate device 102 in more detail. It is noted that the systems depicted in FIGS. 5 and 6 may have some elements in common with the systems illustrated in FIGS. 1-4 described above. Accordingly, common reference numerals have been included to identify these elements in the different figures where appropriate, and certain details regarding these common elements have been omitted from the description of these additional figures if they have already been described in detail above.

As described above, the substrate device 102 and the substrate support surface 110 may include counterpart position units, which may include both counterpart coarse position units 105a,b and counterpart fine position units 107a,b. Generally speaking, the coarse position units 105a,b may provide less accuracy than the fine position units 107a,b but provide a wider field of view. In the illustrated example of FIG. 5, the substrate device 102 is configured to measure positional offsets, e.g., X, Y, and/or θ offsets, between the counterpart position units, and the substrate device includes a communication link to convey position information regarding these offsets to the substrate handler in real-time.

In the system depicted in FIG. 5, the communication link 138 operatively couples the substrate device 102 to the substrate handler 136 so that the substrate device may convey position information regarding these offsets to the substrate handler 136 in real-time, and the substrate handler 136 may re-position the substrate device 102 on the support surface 110 based on the offset information. A control module 150 of the substrate handler 136 may be configured to position the substrate device on the substrate support surface based on the offsets in the position information received via a communication link 138 with the substrate device. For example, in some implementations the robotic handler 136 may be configured to initially position the substrate device on the substrate support surface 110, re-position the substrate device 102 based on the coarse offset information, receive additional fine offset information, and subsequently re-position the substrate device based on the fine offset information.

The handler 136 depicted in FIG. 5 may include an end effector and associated robotic mechanism as well as a computing system operably coupled to the end effector. It is understood that the computing system of the handler may have the control module 150 and communication link 138 and the computing system may or may not be physically encased within the same device that has the end effector and mechanical linkages that physical place the substrate device. As such, conveying the position information may involve any operative communication to the handler that allows the handler to utilize the information in positioning the substrate.

To gather the offset data, in the system of FIGS. 5 and 6 the coarse position unit 105*a* and fine position unit 107*a* of the substrate device 102 include corresponding coarse detector(s) 106*a,b* and fine detector(s) 124, respectively, while the counterpart coarse position units 105*b* and fine position unit 107*b* of the substrate support surface include corresponding coarse targets 104 and fine targets 108*b*. The fine position unit 107*a* of the substrate device 102 also includes fine target(s) 108*a*, that are complementary to the fine targets of the substrate support surface 110, e.g., complementary Vernier patterns as described above.

Preferably, the counterpart position units each include at least two spaced apart sets to facilitate determination of rotational offsets, in addition to X-direction and Y-direction offsets. The targets 104, 108*b* of the coarse and fine position units in the substrate support surface 110 may be included in a mask 118 for the support surface. In some implementations, the mask 118 advantageously has a passive back illumination unit 116 coated on its backside. In some implementations, the substrate device 102 may be configured to illuminate the passive illumination unit 116 of the mask 118 with an illuminator 112. Alternatively, in other implementations it may be possible to illuminate the passive back illumination unit 116 with an illuminator that is not part of the substrate device 102, in which case the illuminator 112 may be omitted from the substrate device.

According to some aspects of the present disclosure, the substrate device 102 of the system 500 may be configured to measure the offsets between the counterpart position units using proximity optics when the substrate device overlies the substrate support surface. The illustrated example of FIG. 6 depicts additional electronics to facilitate functions of the device in some implementations of the present disclosure, such as measurements, calculations, and/or data sensing functionality by the substrate device 102.

As shown in FIG. 6, the substrate device 102 may include one or more data buses 160 to allow communication between various electronic components of the substrate device, as well as a control module control module 170, which may control various functions of the device. The substrate device may include a power control module 164, which may manage power used to operate various processing circuits and other electronics in the device 102. In some implementations, the electronics may derive power from one or more solar cells 166, one or more power storage 162 modules, or both. The power storage module 162 may include one or more batteries, which may optionally be used in conjunction with the solar cells 166 as secondary backup power to the solar cells.

The substrate device may also include a data storage module 168, which may include one or more memory units for storing data that may be gathered by the sensor device and/or for storing software programming that performs some functions in the device. Each of the memory units may be a non-transitory computer readable medium configured to store data and/or processor executable instructions.

FIG. 6 also depicts some electronic components of a coarse position unit 105*a* and a fine position unit 107*a* according to some implementations of the present disclosure. The coarse position unit 105*a* may include an optical detector having one or more linear position sensitive detectors, which are illustrated as a plurality of line cameras in this example. Each of the line cameras may be used to gather proximity data relative to a counterpart target on a substrate support surface. The signal gathered by the line camera may be conditioned by a signal conditioning module and converted to digital form for processing by an analog to digital converter (ADC). The digital signal data may be processing by a processing node in order to determine coarse positional offsets from the measured raw coarse offset data. A communication module of the coarse position unit 105*a* interfaces with the data bus 160, e.g., to transfer data storage 168 or to a substrate handler via the wireless communication link 138. In some implementations, in addition to the wireless communication link 138 that may be used for real-time communication with a substrate handler, the substrate device may also include an additional communication module, which may interface with a RFID coil interface.

In some implementations, the fine position unit 107*a* may also include a fine detector, which in the illustrated example includes a plurality of Vernier sensors, each of which may include a plurality of photodetectors, e.g., photodiodes, photoresistors, phototransistors, photovoltaic cells, CMOS image sensors, charge-coupled devices, and the like, which may be configured as described above. The raw fine offset data gather by the Vernier sensors may also pass through a signal conditioning module, an ADC, and a processing node of the of the fine positioning unit 107*a*, and a communication module of the fine position unit may also interface with the data bus 160.

In addition to the coarse position unit 105*a* and fine position unit 107*a*, the substrate device 102 may also advantageously include other sensing units in some implementations of the present disclosure. The illustrated substrate device includes a vibration unit, which may include one or more motion, orientation, or acceleration sensors 147. Preferably, the motion, orientation, or acceleration sensor(s) are configured to measure motion, orientation, or acceleration (or some combination of two or more of these) in three complementary axes. This allows the substrate device to measure smoothness of the robotic handler during transport and characterize move profiles and mechanical efficacy. Examples of suitable sensors include 3 axis accelerometers, 3 axis gyrometers and, 3 axis compass (magnetic-field) sensors. By way of example, and not by way of limitation, an acceleration profile (including the vibration, which is just the higher frequency content of acceleration) can provide a "fingerprint" that can indicate if the mechanics and or motion controller is behaving out of norm. Detection of out of norm behavior (e.g., by the control module 170) may trigger a maintenance cycle of the substrate handler. In the illustrated example, the substrate device 102 also includes a particulate unit 144 which includes a particulate detector in the form of a particle counter 145 that may be configured to measure particulates in the surrounding air. It is also highly advantageous to include one or more temperature sensors 174, so that the substrate device 102 may gather data regarding temperature and/or humidity in a processing environment.

Various ones of these modules may be implemented in hardware, in software, or in some combination thereof. By way of example, and not by way of limitation, in some implementations various ones of the foregoing modules may be implemented as hardware modules in the form of one or more application specific integrated circuits (ASIC) or field programmable gate arrays (FPGA). By way of further non-limiting example, in some implementations various ones of the forgoing modules may be implemented as software instruction executable by a processor unit.

Figure 7:
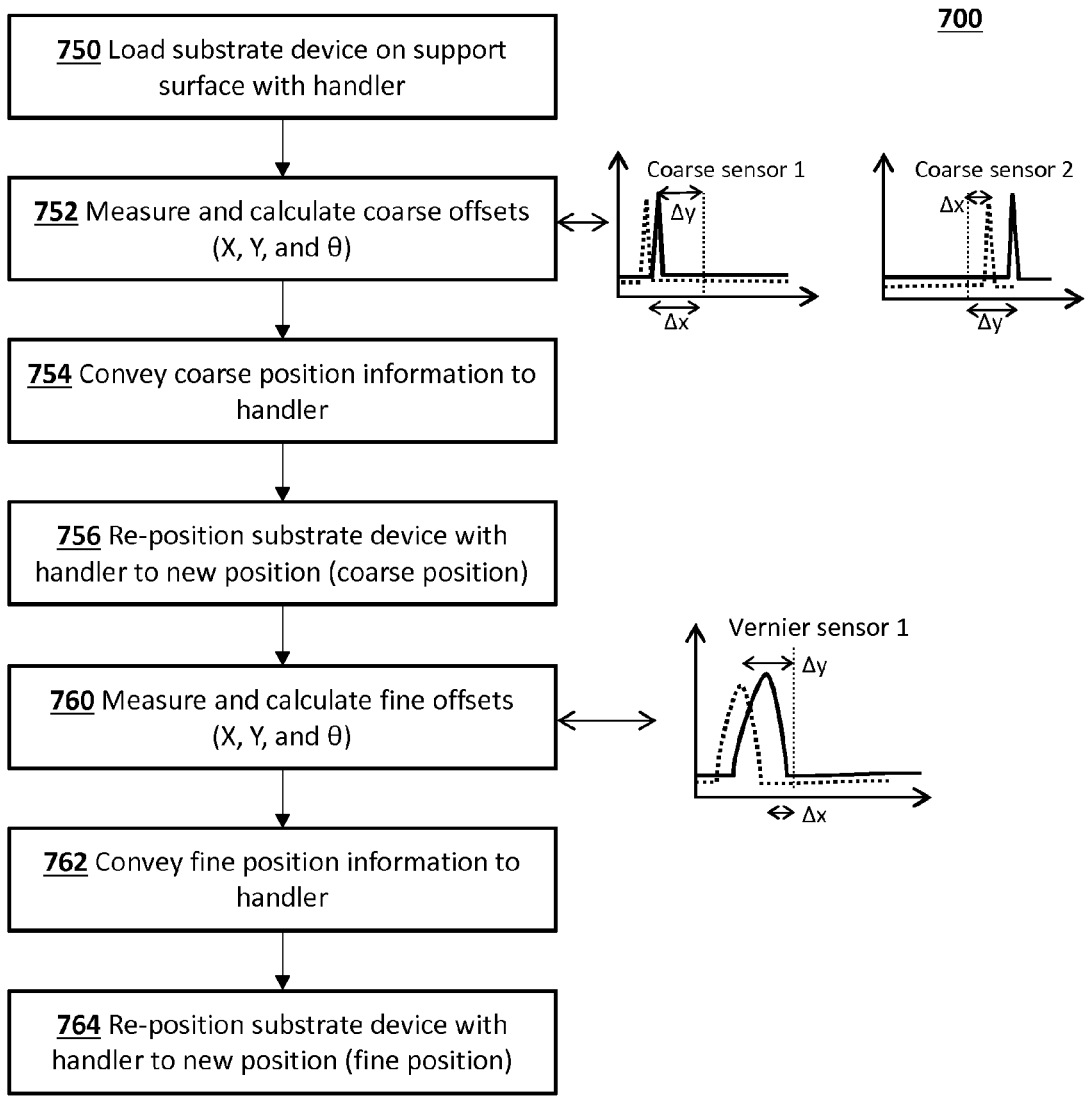
FIG. 7 is a flow diagram of a method according to certain aspects of the present disclosure.

Turning now to FIG. 7, a method 700 is depicted according to some implementations of the present disclosure. The method 700 may be implemented in a system having a substrate device, a substrate support surface, and a handler which positions the substrate device on the support surface that is similar to any of those described above with reference to FIGS. 1-6.

As indicated at 750, the method may include initially loading a substrate device onto a support surface with a handler. In some implementations, the substrate support surface is a support surface of a wafer stage that is part of a tool. By way of example, and not by way of limitation, the tool may be a tool for reviewing substrates, such as an inspection or metrology tool, and the tool may include an electron microscope or other electron beam system. More generally, the tool may be any tool that includes a stage and a substrate handler. The substrate device may be delivered to the tool in a substrate carrier, such as a FOUP, and initially loading the substrate at 750 may involve removing the substrate device from the FOUP and placing it on the substrate support surface. In some implementations, the substrate device may be initially placed to within a circle on a stage, and the circle may have a diameter of about 9 mm.

After the substrate device is initially placed, the coarse offset measurements may be taken between the course position units of the substrate device and the substrate support surface, as indicated at 752. In some instances, additional calculations are required to determine the offsets from the raw measured offset data. The coarse offsets may include X-direction offsets, Y-direction offsets, and/or rotational (θ-direction) offsets, and it preferably includes all three. As indicated at 754, the coarse position information regarding the coarse offsets is then conveyed to the substrate handler. As indicated at 756, the substrate device may then be re-positioned on the substrate support surface by the handler based on the coarse position information.

Once the substrate device has been coarsely positioned on the support surface, the method 700 may then include a fine measurement and positioning process associated with the fine position units. As indicated at 760, 762, and 764, the fine positioning may have similarities to the coarse positioning, although this time measurements between the fine position units may be taken and used for further corrections. In some implementations, the fine position units of the substrate device and support surface each include opposing masks having complementary Vernier patterns, in accordance with aspects of the present disclosure described above. Measurements from the Vernier sensors may be taken to gather the fine offset data, as indicated at 760. The fine offset measurement data may need to be normalized and further calculations may need to be performed in order to determine the fine offsets between the counterpart fine position units. As indicated at 762, fine position information regarding the measured fine offsets may then be conveyed to the handler. The substrate device may again be re-positioned to a new fine position based on the fine position information, as indicated 764.

In preferred implementations of the present disclosure, the coarse and fine offset information is measured by the substrate device, and then the corresponding coarse and fine position information is conveyed to the handler from the substrate device. In these implementations, the substrate device may be operatively coupled to the handler via a wireless communication link, and the position information may be conveyed at 754 and 762 via the wireless communication link from the substrate device. However, in other implementations it is possible for the offsets to be measured by detectors in the substrate support surface or some other device, which may then convey the associated information to the handler for further placement, in which case the substrate device may not need to be operatively coupled to the handler.

It is further noted that the coarse and fine position information that is conveyed may be any information derived from coarse offset measurements between the coarse units and the fine offset measurements between the fine units respectively. For example, the conveyed position information may be final position corrections based on the corresponding offsets, calculated offsets determined from the raw offset measurements, the raw measured offset data, or some other position information regarding the coarse offset measurements.

In some implementations the method may involve illuminating a passive back illumination unit of the substrate support surface concurrently during at least each of the measurement steps, e.g., the coarse and fine offset measurements.

It is also noted that each of the steps in FIG. 7 is performed automatically by the system so that the substrate may be accurately positioned efficiently without requiring human intervention. Logic causing some or all of the forgoing method to be performed may be embodied in hardware, software, or some combination thereof. For example, it may be embodied in hardware in the form of one or more ASICs or FPGAs, as processor executable instructions stored in a non-transitory computer readable medium, or some combination thereof, which causes a computing system having the substrate device, the substrate support surface, and the handler to perform some or all of the forgoing method.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "a", or "an" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A substrate device, comprising:
  a first coarse position unit that is a counterpart to a second coarse position unit of a substrate support surface, and
  a first fine position unit that is a counterpart to a second fine position unit of the substrate support surface,
  wherein the substrate device is configured to measure coarse positional offsets between the first and second coarse position units, and wherein the substrate device is configured to measure fine positional offsets between the first and second fine position units.

2. The substrate device of claim 1, further comprising a wireless communication link, wherein the substrate device is configured to convey position information regarding the coarse positional offsets and the fine positional offsets via the wireless communication link in real-time.

3. The substrate device of claim 1,
wherein the first coarse position unit comprises at least one optical detector,
wherein the second coarse position unit of the substrate support surface comprises at least one coarse target,
wherein the substrate device is configured to measure the coarse positional offsets by measuring a relative position of the at least one coarse target via the at least one optical detector.

4. The substrate device of claim 3,
wherein the at least one coarse target is at least two spaced apart crosshair targets.

5. The substrate device of claim 4,
wherein the at least one optical detector is at least two spaced apart sets of position sensitive detectors in which each set of the at least two sets comprises one or more optical detectors.

6. The substrate device of claim 4,
wherein each crosshair target of the at least two crosshair targets comprises an outwardly extending portion that increases in width as it extends away from a center of the crosshair target.

7. The substrate device of claim 3, wherein the at least one optical detector is a two-dimensional (2D) position sensitive detector configured to detector illumination from the at least one coarse target.

8. The substrate device of claim 1,
wherein the first fine position unit of the substrate device comprises at least one first Vernier pattern that is complementary to at least one second Vernier pattern in the second fine position unit of the substrate support surface, wherein the first fine position unit further comprises a set of photodetectors, and
wherein the substrate device is configured to measure the fine offsets by measuring offsets between the complementary first and second Vernier patterns via the set of photodetectors.

9. The substrate device of claim 8,
wherein the at least one first Vernier pattern is at least two spaced apart first Vernier patterns, and
wherein the at least one second Vernier pattern in the second fine position unit of the substrate support surface is at least two spaced apart second Vernier patterns complementary to the at least two spaced apart first Vernier patterns.

10. The substrate device of claim 1, further comprising at least one illuminator configured to illuminate a passive back illumination unit on a backside of the second coarse position unit and the second fine position unit.

11. The substrate device of claim 10,
wherein the passive back illumination unit of the substrate support surface is a phosphor and the at least one illuminator is at least one light source configured to provide illumination to the phosphor.

12. The substrate device of claim 11, wherein the passive back illumination unit includes an optical element configured to guide light from the light source to the phosphor.

13. The substrate device of claim 11, wherein the passive back illumination unit includes an optical element disposed between the light source and the phosphor, wherein the optical element is configured to make uniform illumination provided by the phosphor to a coarse target.

14. The substrate device of claim 10 wherein the passive back illumination unit of the substrate support surface is a non-phosphor illumination unit.

15. The substrate device of claim 1, further comprising at least one motion, orientation, or acceleration sensor configured to measure one or more of motion, orientation, or acceleration of the substrate device in three complementary axes.

16. The substrate device of claim 1, further comprising a particulate detector configured to measure particulate matter in surrounding air.

17. The substrate device of claim 1,
wherein the substrate device comprises a wafer substrate and electronics disposed on the wafer substrate,
wherein the first coarse position unit and the first fine position unit are disposed on the wafer substrate.

18. The substrate device of claim 17,
wherein the wafer substrate is a silicon wafer having a diameter of 100 to 450 millimeters.

19. The substrate device of claim 1,
wherein the coarse position offsets include X-direction coarse offsets, Y-direction coarse offsets, and rotational coarse offsets, and
wherein the fine position offsets include X-direction fine offsets, Y-direction fine offsets, and rotational fine offsets.

20. The substrate device of claim 1, further comprising:
a wireless communication link,
wherein the substrate device is configured to convey position information regarding the coarse positional offsets and the fine positional offsets via the wireless communication link in real-time,
wherein the second coarse position unit of the substrate support surface comprises at least at least two spaced apart crosshair targets,
wherein the first coarse position unit comprises at least two spaced apart sets of position sensitive detectors in which each set of the at least two sets comprises a pair of substantially perpendicular position sensitive detectors,
wherein the substrate device is configured to measure the coarse positional offsets by measuring a relative position of each of the at least two spaced apart crosshair targets via each of the at least two spaced apart sets of position sensitive detectors,
wherein the first fine position unit comprises a set of photodiodes and at least two spaced apart first Vernier patterns in which each of the first Vernier patterns are complementary to at least two spaced apart second Vernier patterns in the second fine position unit of the substrate support surface,
wherein the substrate device is configured to measure the fine offsets by measuring offsets between the complementary first and second Vernier patterns via the set of photodiodes.

21. The substrate device of claim 20, further comprising:
at least one motion, orientation, or acceleration sensor configured to measure at least one of motion, orientation, or acceleration of the substrate device in three complementary axes;
at least one particulate detector configured to measure particulate matter in surrounding air; and
at least one illuminator configured to illuminate a passive back illumination unit on a backside of the second coarse position unit and the second fine position unit of the substrate support surface,
wherein the substrate device comprises a wafer substrate and electronics disposed on the wafer substrate,
wherein the first coarse position unit, the first fine position unit, the at least one motion, orientation, or acceleration sensor, the at least one particulate detector, and the illuminator are disposed on the wafer substrate.

22. A method of using the substrate device of claim 1, the method comprising:
initially positioning the substrate device on the substrate support surface with a substrate handler;
measuring coarse positional offsets between the first and second coarse position units with the substrate device;
transmitting coarse position information regarding the coarse positional offsets from the substrate device to the substrate handler;
re-positioning the substrate device on the substrate support surface with the substrate handler based on the coarse position information;
after the re-positioning, measuring fine positional offsets between the first and second fine position units; and
transmitting fine position information regarding the fine positional offsets from the substrate device to the substrate handler.

23. A mask for a substrate support surface that receives a substrate device, the mask comprising:
a second coarse position unit that is a counterpart to a first coarse position unit of the substrate device; and
a second fine position unit that is a counterpart to a first fine position unit of the substrate device,
wherein the second coarse position unit comprises at least one coarse target,
wherein the second fine position unit comprises at least one fine target, and wherein the second coarse position unit and the second fine position unit are configured to gather information regarding a relative position between the substrate device and the substrate support surface.

24. The mask of claim 23,
wherein the at least one coarse target is at least one crosshair target, and
wherein the at least one fine target is at least one second Vernier pattern that is complementary to at least one first Vernier pattern of the first fine position unit of the substrate device.

25. The mask of claim 24,
wherein the at least one crosshair target is at least two spaced apart crosshair targets,
wherein the at least one second Vernier pattern is at least two spaced apart second Vernier patterns, and
wherein the at least one first Vernier pattern in the first fine position unit of the substrate device is at least two spaced apart first Vernier patterns complementary to the at least two spaced apart second Vernier patterns.

26. The mask of claim 25,
wherein each crosshair target of the at least two crosshair targets comprises an outwardly extending portion that increases in width as it extends away from a center of the crosshair target.

27. The mask of claim 23,
wherein the support surface is a wafer stage and the mask is a stage mask for the wafer stage.

28. The mask of claim 23, further comprising:
a passive back illumination unit on the backside of the mask.

29. The mask of claim 28,
wherein passive back illumination unit is a phosphor or a microstructured surface.

30. The mask of claim 28, wherein the passive back illumination unit of the substrate support surface is a non-phosphor illumination unit.

31. A system comprising:
a) a substrate device;
b) a substrate support surface; and
c) a substrate handler configured to position the substrate device on the substrate support surface,
wherein the substrate device comprises:
i) a first coarse position unit, and
ii) a first fine position unit,
wherein the substrate support surface comprises:
i) a second coarse position unit that is a counterpart to the first coarse position unit, and
ii) a second fine position unit that is a counterpart to the first fine position unit,
wherein the system is configured to measure coarse positional offsets between the first and second coarse position units, re-position the substrate device on the substrate support surface based on the coarse positional offsets, and subsequently measure fine positional offsets between the first and second fine position units.

32. The system of claim 31,
wherein the substrate device comprises a wireless communication link,
wherein the substrate device is configured to measure the coarse positional offsets and the fine positional offsets,
wherein the substrate device is configured to convey the coarse positional offsets and the fine positional offsets to the substrate handler via the wireless communication link in real-time during positioning of the substrate device on the substrate support surface by the substrate handler.

33. The system of claim 31,
wherein the first coarse position unit of the substrate device comprises at least one optical detector,
wherein the second coarse position unit of the substrate support surface comprises at least one coarse target.

34. The system of claim 33,
wherein the at least one coarse target is at least two spaced apart crosshair targets,
wherein the at least one optical detector is at least two spaced apart sets of position sensitive detectors in which each set of the at least two sets comprises one or more optical detectors.

35. The system of claim 34, wherein the at least one coarse target is a spot of illumination and wherein the at least one optical detector is a two-dimensional (2D) position sensitive detector configured to detector illumination from the spot of illumination.

36. The system of claim 31,
wherein the first fine position unit comprises at least one first Vernier pattern and the second fine position unit comprises at least one second Vernier pattern complementary to the first Vernier pattern.

37. The system of claim 34,
wherein at least one first Vernier pattern is at least two spaced apart first Vernier patterns, and
wherein the at least one second Vernier pattern is at least two spaced apart second Vernier patterns complementary to the at least two spaced apart first Vernier patterns.

38. The system of claim 37,
wherein the first fine position unit comprises a set of photodiodes, and
wherein the substrate device is configured to measure the fine offsets by measuring offsets between the complementary first and second Vernier patterns via the set of photodiodes,
wherein the first fine position unit further comprises a set of photodetectors, and
wherein the substrate device is configured to measure the fine offsets by measuring offsets between the complementary first and second Vernier patterns via the set of photodetectors.

39. The system of claim 31,
wherein the substrate support surface comprises a mask having the second coarse position unit and the second fine position unit, and
wherein the substrate support surface comprises a passive back illumination unit on a backside of the mask.

40. The system of claim 39,
wherein the substrate device comprises at least one illuminator configured to illuminate the passive back illumination unit of the substrate support surface.

41. The system of claim 31,
wherein the substrate device further comprises one or more motion, orientation, or acceleration sensors configured to measure one or more of motion, orientation, or acceleration of the substrate device in three complementary axes.

42. The system of claim 31,
wherein substrate device further comprises a particulate detector configured to measure particulate matter in surrounding air.

43. The system of claim 31,
wherein the substrate device comprises a wafer substrate and electronics disposed on the wafer substrate,
wherein the first coarse position unit and the first fine position unit are disposed on the wafer substrate.

* * * * *